(12) United States Patent
Esnard

(10) Patent No.: US 8,258,751 B2
(45) Date of Patent: Sep. 4, 2012

(54) METHOD AND SYSTEM FOR TRACKING BATTERY STATE-OF-HEALTH BASED ON CHARGING INFORMATION

(75) Inventor: Domitille Esnard, Biot (FR)

(73) Assignee: Broadcom Corporation, Irvine, CA (US)

( * ) Notice: Subject to any disclaimer, the term of this patent is extended or adjusted under 35 U.S.C. 154(b) by 670 days.

(21) Appl. No.: 12/018,425

(22) Filed: Jan. 23, 2008

(65) Prior Publication Data
US 2009/0128097 A1 May 21, 2009

Related U.S. Application Data

(60) Provisional application No. 60/988,230, filed on Nov. 15, 2007.

(51) Int. Cl.
*H02J 7/00* (2006.01)
(52) U.S. Cl. .......................... 320/132; 320/133; 324/426
(58) Field of Classification Search .................... 320/132
See application file for complete search history.

(56) References Cited

U.S. PATENT DOCUMENTS

| | | | |
|---|---|---|---|
| 6,469,512 B2 * | 10/2002 | Singh et al. | 324/426 |
| 2003/0052647 A1 * | 3/2003 | Yoshida et al. | 320/125 |
| 2004/0257045 A1 * | 12/2004 | Sada et al. | 320/132 |
| 2009/0171600 A1 * | 7/2009 | Machiyama | 702/63 |

* cited by examiner

*Primary Examiner* — Arun Williams
(74) *Attorney, Agent, or Firm* — Fiala & Weaver P.L.L.C.

(57) ABSTRACT

Methods, systems, and apparatuses for determining battery state of health are provided. A battery that is substantially uncharged is charged with a substantially constant charge current. A time duration of the charging of the battery with the substantially constant charge current is determined. A state of health of the battery is estimated based upon the determined time duration and the constant charge current. The state of health of the battery may be calculated by multiplying the determined time duration with a value of the constant charge current to determine a total accumulated charge, and applying a predetermined factor to the accumulated charge to determine the state of health. The predetermined factor is a fixed percentage of the total charge capacity of the battery that corresponds to the battery type.

20 Claims, 4 Drawing Sheets

100

400

METHOD AND SYSTEM FOR TRACKING BATTERY STATE-OF-HEALTH BASED ON CHARGING INFORMATION

This application claims the benefit of U.S. Provisional Application No. 60/988,230, filed on Nov. 15, 2007, which is incorporated by reference herein in its entirety.

BACKGROUND OF THE INVENTION

1. Field of the Invention

The present invention relates to batteries, and in particular, to the monitoring of battery capacity.

2. Background Art

A battery is a device that provides electrical energy used to power an electrical device. A battery typically includes one or more electrochemical cells that store chemical energy, which is converted to electrical energy output by the device to provide power. Batteries are used in a multitude of electrical devices, such as electrical devices that are mobile, are small, and/or are unable to be constantly connected to another power source such as AC (alternating current) power. Batteries may also be used in electrical devices as a backup power source, to provide power when a primary power source is lost.

A rechargeable battery is a type of battery that is becoming increasingly popular. A rechargeable battery can be restored to full charge by the application of electrical energy. Rechargeable batteries based on lithium, such as lithium ion and lithium polymer batteries, are becoming increasingly widespread. A typical charging cycle for a lithium rechargeable battery includes a first charge phase, where a constant current is used to charge the battery (while battery voltage increases), and a second charge phase, where a constant voltage is applied to the battery to finish charging the battery (while the charge current decreases). Typically, the maximum amount of charge that a lithium battery can maintain decreases with age.

Techniques exist for determining a stored charge in batteries (battery "state of charge"), and for determining an overall charge storage capacity of batteries (battery "state of health"). Conventional techniques for determining battery state of health measure an accumulated charge occurring during an entire charge cycle for the battery. Such techniques have disadvantages. For example, it is difficult to accurately measure the charge being stored in the battery. In particular, with regard to a lithium battery, the level of current entering the battery is very small towards the end of the constant voltage charging phase. For example, this amount of current may be less than 5 mA for a 100 mAH battery. Any inaccuracy in the current measuring components will cause a measurement of this small current to be incorrect. Thus, estimations of state of health performed while charging a battery can be inaccurate. In a similar fashion, estimations of battery state of health performed while discharging a battery are also known to be inaccurate.

Conventional circuits used to determine battery state of health are relatively complex, which may be undesirable, particularly in smaller sized devices. For example, a fuel gauging resistor and an analog to digital converter (ADC) are typically needed to track the charge current during the entire charging cycle. Such components undesirably add to the cost and complexity of the electrical device that uses the battery.

What is desired are ways of determining battery state of health that are more accurate and less complex than conventional techniques.

BRIEF SUMMARY OF THE INVENTION

Methods, systems, and apparatuses for determining battery state of health are provided. A battery that is substantially uncharged is received. The battery is charged with a substantially constant charge current. A time duration of the charging of the battery with the substantially constant charge current is determined. A state of health of the battery is estimated based upon the determined time duration and the constant charge current. Furthermore, the state of charge of the battery may be calculated based on the calculated state of health.

For instance, the state of health of the battery may be calculated by multiplying the determined time duration with a value of the constant charge current to determine a total accumulated charge. A predetermined factor may be applied to the determined accumulated charge to determine the state of health. The predetermined factor is a fixed percentage of the total charge capacity of the battery. The factor may be predetermined based on a type of battery, a charge storage capacity/size of the battery, manufacturing techniques used to fabricate the battery, and/or on other characteristic of the battery.

In a further aspect of the present invention, a system for determining battery health includes a battery charger, a charge timer, and a battery state of health calculator. The battery charger is configured to charge a battery from a substantially uncharged state with a substantially constant charge current (during a first charge phase). The charge timer is configured to determine a time duration of charging the battery by the battery charger from the substantially uncharged state with the substantially constant charge current. The battery state of health calculator is configured to calculate a state of health of the battery based upon the determined time duration and the constant charge current.

The battery charger may be further configured to further charge the battery using a substantially constant voltage signal (during a second charge phase) after charging the battery with the substantially constant charge current.

In a further aspect, the system may include a battery state of charge calculator configured to calculate a state of charge of the battery based upon the calculated state of health.

In a still further aspect of the present invention, an electrical device includes a battery monitor and a battery port. The battery monitor includes the battery charger, charge timer, and battery state of health calculator. The battery port is configured to interface the battery with the device.

In a further aspect, the electrical device includes an indicator configured to provide an indication of the calculated state of health of the battery and/or the calculated state of charge of the battery.

These and other objects, advantages and features will become readily apparent in view of the following detailed description of the invention. Note that the Summary and Abstract sections may set forth one or more, but not all exemplary embodiments of the present invention as contemplated by the inventor(s).

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

Figure 1:
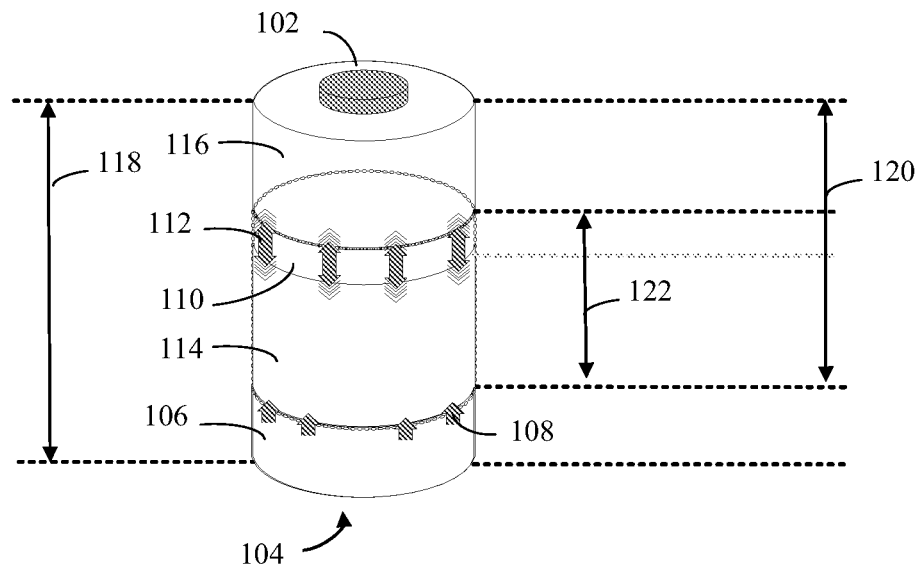
FIG. 1 shows a graphical representation of example charge characteristics of a battery.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

Introduction

The present specification discloses one or more embodiments that incorporate the features of the invention. The disclosed embodiment(s) merely exemplify the invention. The scope of the invention is not limited to the disclosed embodiment(s). The invention is defined by the claims appended hereto.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

Example Battery Characteristics

Embodiments of the present invention relate to batteries. A battery is a device that provides electrical energy used to power an electrical device. A battery typically includes one or more electrochemical cells that store chemical energy, which is converted to electrical energy that is output by the device to provide power. FIG. 1 shows a view representing charge characteristics of a battery 100, which are described in detail below. Battery 100 has a first terminal 102 (e.g., negative or positive polarity) and a second terminal 104 (with polarity opposite that of first terminal 102). Battery 100 is a rechargeable battery formed of a material that enables recharging. For example, battery 100 may be a lithium-based rechargeable battery, such as a lithium ion (Li-ion) or lithium ion polymer (Li-ion polymer) battery. Rechargeable batteries can be restored to full charge by the application of electrical energy.

Figure 2:
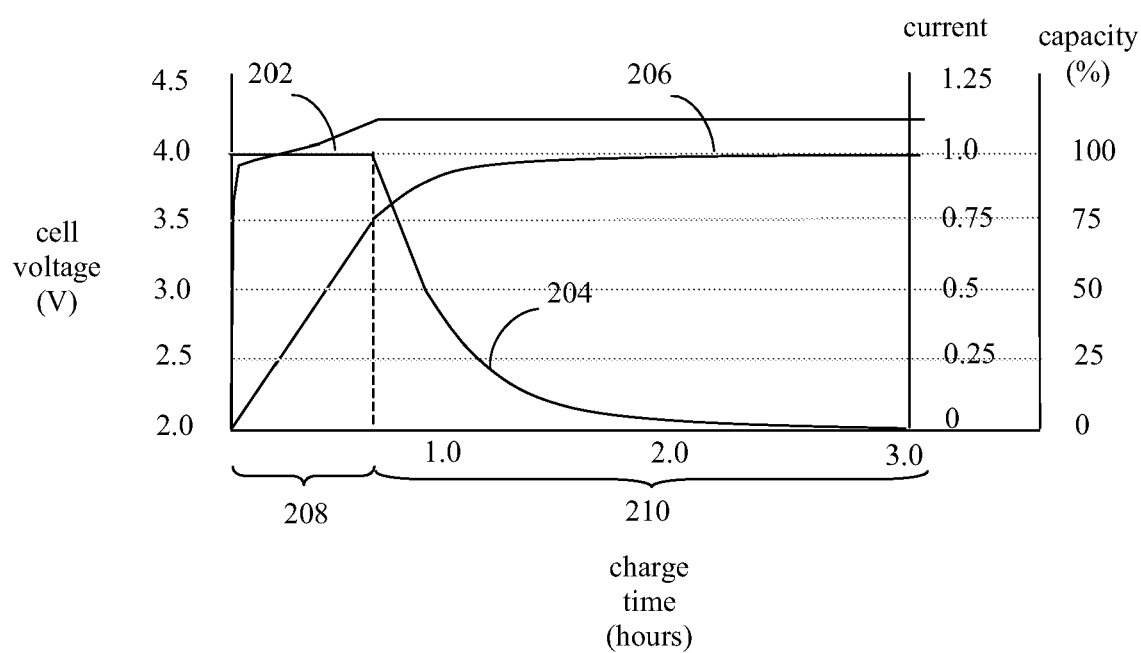
FIG. 2 shows a graph illustrating a typical charging cycle for a rechargeable battery.

FIG. 2 shows a graph 200 illustrating waveforms that represent a typical charging cycle for a rechargeable lithium-based (e.g., lithium ion or lithium polymer) battery. Graph 200 has a horizontal axis that indicates units of charge time (hours). Graph 200 has a first vertical axis indicating cell voltage (Volts) with regard to a voltage waveform 202, a second vertical axis indicating current with regard to a current waveform 204, and a third vertical axis indicating charge capacity percentage (%) with regard to a charge waveform 206. As shown in FIG. 2, current waveform 204 includes a first charge phase 208 and a second charge phase 210. During first charge phase 208, a substantially constant current is used to charge the battery (while battery voltage increases as indicated by voltage waveform 202). First charge phase 208 typically is complete when battery 100 reaches its maximum typical voltage. During second charge phase 210, a substantially constant voltage is applied to the battery to finish charging the battery (while the charge current decreases as indicated by current waveform 204). After second charge phase 210, battery 100 is charged to its maximum charge capacity (100%), as indicated by charge waveform 206. Typically, the maximum amount of charge that a rechargeable battery can maintain decreases with age.

The behavior of a lithium battery is complex, involving chemical reactions, reaction kinetics, and diffusion processes. Thus, a circuit equivalent model of a lithium battery is complex, as it typically includes non-linear components. In FIG. 1, the illustrated total volume of battery 100 represents the initial (e.g., when the battery is manufactured) total charge capacity of battery 100 (also indicated by initial total charge 118 in FIG. 1). A charged portion 114 of battery 100 is shown in FIG. 1 that contains available charge. An uncharged portion 116 of battery 100 is shown in FIG. 1. Uncharged portion 116 is a charge-free or uncharged portion of battery 100, which may be uncharged because battery 100 was not fully charged on a previous charge cycle, because charge has recently been supplied by battery 100, and/or for other reason. As battery 100 ages, cell(s) of battery 100 will oxidize. An oxidized portion 106 shown at the bottom of battery 100 in FIG. 1 represents a portion of the total charge volume of battery 100 that is lost due to aging related oxidation. As indicated by arrows 108, a size of oxidized portion 106 increases during the life of battery 100. Thus, oxidized portion 106 represents a decrease over time in the amount of charge that battery 100 may store due to aging-related oxidation.

A charge process equilibrium portion 110 of battery 100 is also shown in FIG. 1. Charge process equilibrium portion 110 represents an unknown state of battery 100 due mainly to the discharge rate of battery 100. As indicated by arrows 112 in FIG. 1, the charge volume of portion 110 may fluctuate. The charge volume of portion 110 depends on various parameters, such as the aging of battery 100, a state of charge of battery 100, a history of battery 100, a temperature of battery 100, etc. In portion 110, electrons are in transition after a charging or discharging event, but typically come to equilibrium after time (e.g., after 1 hour).

A state of health (SOH) 120 of battery 100 is indicated in FIG. 1. SOH 120 represents a total charge capacity of battery 100—an amount of charge that may actually be available in battery 100, taking into account aging of battery 100. SOH 120 of battery 100 is conventionally calculated according to $$SOH = ICC \times (100\% - DCCP) \qquad \text{Equation 1}$$

where

ICC=initial charge capacity of battery 100, and

DCCP=decreased charge capacity of battery 100.

The decreased charge capacity of battery 100 may be due to oxidized portion 106. For instance, if battery 100 has an initial charge capacity of 130 mAH (milli-Ampere-hour) (initial total charge 118) that has decreased by 20%, SOH 120 of battery 100 may be calculated as $$SOH = 130 \text{ mAH}(100\% - 20\%) = 104 \text{ mAH}.$$

In this example, when fully charged, battery 100 is able to provide 104 mAH of charge, which is a reduction from the initial charge capacity of battery 100 of 130 mAH.

Figure 3:
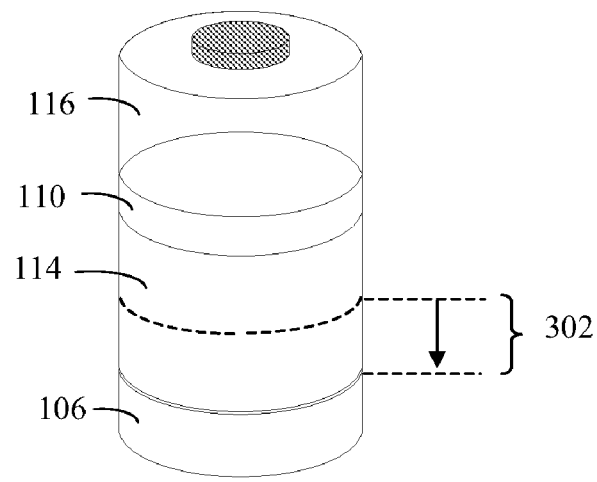
FIG. 3 shows the battery of FIG. 1 during a discharge period.

A state of charge (SOC) 122 of battery 100 represents an amount of charge currently in battery 100 that can be used. SOC 122 is typically defined as a percentage. SOC 122 of battery 100 is conventionally determined according to a coulomb counting approach. According to the coulomb counting approach, charging and/or discharging of battery 100 is monitored to determine the amount of charge entering or leaving battery 100. For example, FIG. 3 shows battery 100 during a discharge period. In FIG. 3, an amount of charge represented by discharge portion 302 leaves battery 100, decreasing the amount of charged portion 114 of battery 100. This amount of discharge may be estimated. During a time duration T, an amount of charge Q entering or leaving battery 100 may be estimated according to $$Q = I \times T \qquad \text{Equation 2}$$

where
I=a current flowing into or out of battery 100 during time duration T.

SOC 122 may be calculated based on SOH 120, according to $$SOC(\%) = RC/SOH \qquad \text{Equation 3}$$

where
RC=remaining charge stored in battery 100.

RC may be calculated in various ways, including according to $$RC = SOH - Q \qquad \text{Equation 4}$$

where Q is determined according to Equation 2 above, such that T is the time duration measured from last time when battery 100 was fully charged.

An electrical device that uses battery 100 for power may use the coulomb counting approach to perform its battery fuel gauging. For instance, the device may use the coulomb counting approach to determine SOC 122, determining that battery 100 is "42% full," for example. To make this determination using the coulomb counting approach, the electrical device must track SOH 120 for battery 100 (i.e., determining the capacity of battery 100, which may change over the time due to aging, bad usage of battery 100, and/or other factors). It is difficult to accurately measure the charge stored in a battery in order to track SOH 120, by measuring the current flowing into and out of the battery. In particular, towards the end of the constant voltage charging phase (second charge phase 210), the level of current entering battery 100 is very small. For example, the amount of current may be less than 5 mA for a 100 mAH battery. Any inaccuracy in the current measuring components of the electrical device will cause the current measurement to be incorrect. The electrical device typically will have a fuel gauging resistor and an analog to digital converter (ADC) that track the charge current during the whole charging cycle. Such components must be relatively precise to provide accurate results, and undesirably add to the cost of the electrical device.

Embodiments of the present invention enable the determination of battery state of health in a less complex and less expensive manner than conventional techniques. Example embodiments of the present invention are described in detail in the following section.

Example Embodiments

The example embodiments described herein are provided for illustrative purposes, and are not limiting. The examples described herein may be adapted to any type of electrical device. Furthermore, additional structural and operational embodiments, including modifications/alterations, will become apparent to persons skilled in the relevant art(s) from the teachings herein.

In embodiments of the present invention, battery state of health may be determined in a manner that does not require precision measuring components. For example, the fuel gauging resistor that is present in conventional devices for current measuring is not required in embodiments. The accuracy of the remaining components used for determining battery state of health may be reduced, in embodiments.

Figure 4:
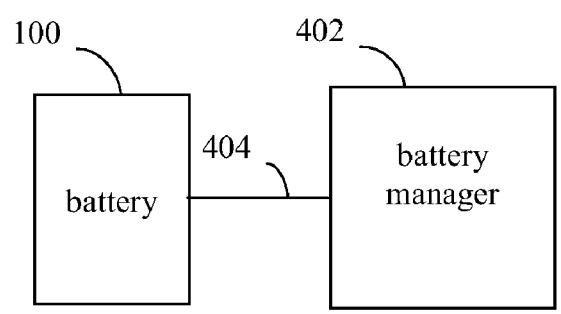
FIG. 4 shows a block diagram of a battery management system, according to an example embodiment of the present invention.
Figure 5:
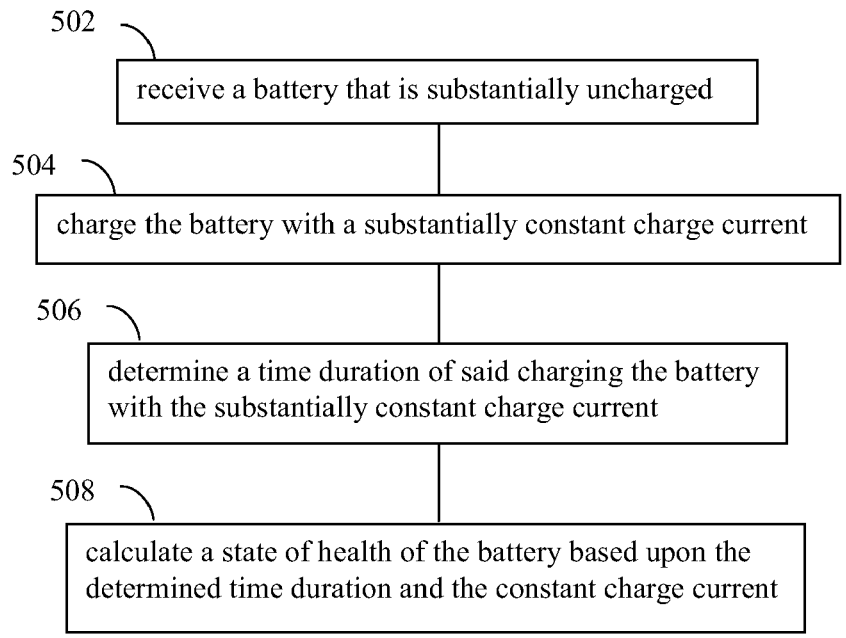
FIG. 5 shows a flowchart providing example steps for determining battery state of health, according to an example embodiment of the present invention.

FIG. 4 shows a battery management system 400, according to an example embodiment of the present invention. Battery management system 400 includes battery 100 and a battery manager 402. Battery management system 400 is coupled to battery 100 by an electrical connection 404, and is configured to determine SOH 120 for battery 100. FIG. 5 shows a flowchart 500 providing example steps for determining battery state of health, according to an example embodiment of the present invention. For example, battery management system 400 may perform flowchart 500, in an embodiment. Other structural and operational embodiments will be apparent to persons skilled in the relevant art(s) based on the discussion regarding flowchart 500. Flowchart 500 is described as follows.

Flowchart 500 begins with step 502. In step 502, a battery is received that is substantially uncharged. For example, in an embodiment, battery 100 is received, where charged portion 114 is substantially empty of charge (i.e., battery 100 is uncharged). Battery 100 may be received uncharged, or may be received charged and may be subsequently discharged, in step 502.

Figure 6:
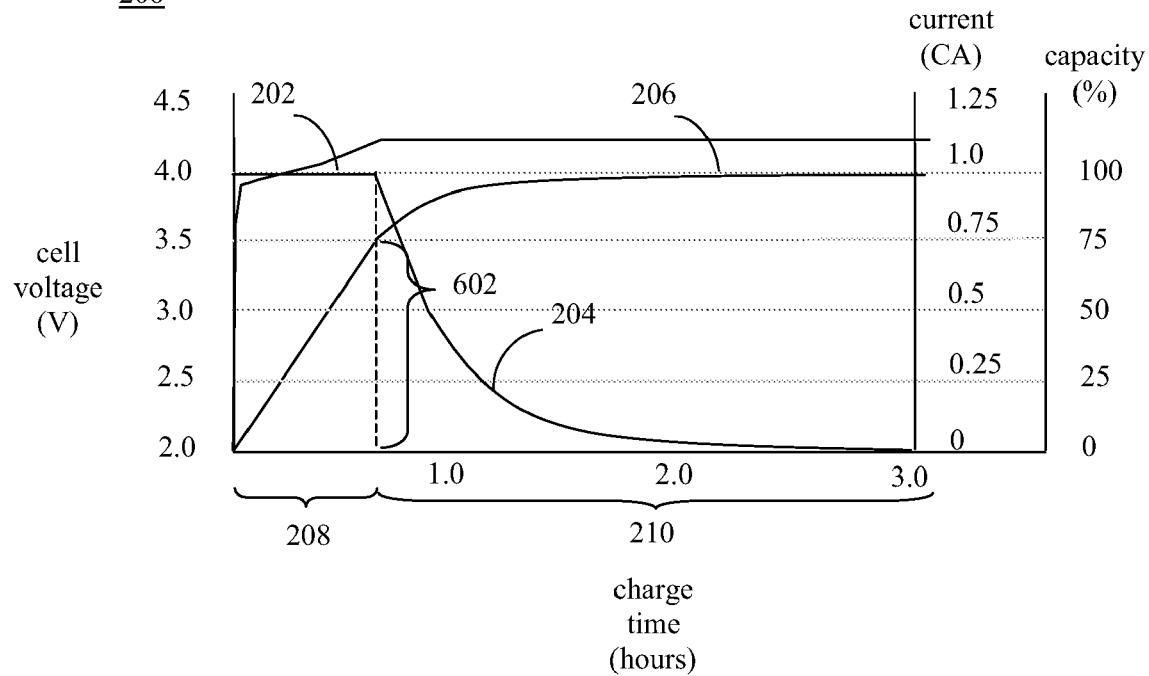
FIG. 6 shows the graph of FIG. 2, further indicating a predetermined charge factor, according to an embodiment of the present invention.

In step 504, the battery is charged with a substantially constant charge current. For example, FIG. 6 shows graph 200 of FIG. 2, illustrating current waveform 204 for charging battery 100. During first charge phase 208, a substantially constant current is used to charge battery 100, as indicated by current waveform 204. As shown in FIG. 4, the substantially constant current of first charge phase 208 may be provided to battery 100 from battery manager 402 over electrical connection 404. Electrical connection 404 may include a first electrical connection to a positive terminal (e.g., terminal 102 or terminal 104) of battery 100, and a second electrical connection to a negative terminal of battery 100. The charge current may be generated in any manner, as would be known to persons skilled in the relevant art(s).

Figure 7:
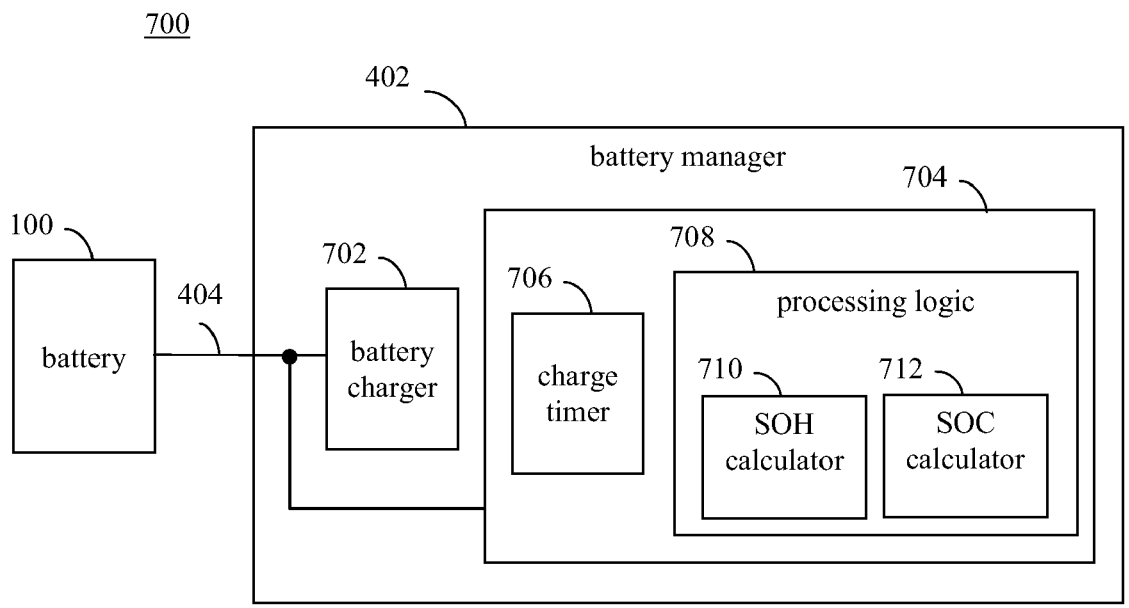
FIG. 7 shows a block diagram of an example of the battery management system of FIG. 4, according to an embodiment of the present invention.

For instance, FIG. 7 shows a battery management system 700, as an example of battery management system 400 in FIG. 4, according to an embodiment of the present invention. As shown in FIG. 7, battery management system 700 includes battery 100 and battery manager 402, which are coupled together by electrical connection 404. In the embodiment of FIG. 7, battery manager 402 includes a battery charger 702 and a battery monitor 704. Battery charger 702 may be configured to perform step 504. Battery charger 702 may be configured to charge battery 100 according to waveform 202 shown in FIG. 6. Battery charger 702 may be any suitable type of battery charger, including a commercially available battery charger or proprietary battery charger.

In step 506, a time duration of charging the battery with the substantially constant charge current is determined. Battery manager 402 shown in FIG. 4 is configured to measure the amount of time during which battery 100 is charged with the substantially constant charge current during step 504. For example, as shown in FIG. 7, in an embodiment, battery monitor 704 may include a charge timer 706. Charge timer 706 may perform step 506. As shown in FIG. 7, battery monitor 704 is coupled to electrical connection 404 to enable monitoring of the charge current being provided to battery 100 by battery charger 702 over electrical connection 404 during first charge phase 208. Charge timer 706 may include any type of timing mechanism to determine the time duration of charging battery 100 in step 504. For example, charge timer 706 may include analog or digital logic configured as a timer or counter, may be implemented in a processor, and/or may include any other timing mechanism, to measure the time duration.

In step 508, a state of health of the battery is calculated based upon the determined time duration and the constant charge current. Battery manager 402 shown in FIG. 4 is configured to calculate the state of health of battery 100 using the time duration determined in step 506, and the charge current supplied to battery 100 in step 504. For example, in an embodiment, battery monitor 704 includes a processing logic 708. Processing logic 708 may be configured to perform step 508. As shown in FIG. 7, processing logic 708 may include a SOH calculator 710. SOH calculator 710 is configured to calculate SOH 120. In an embodiment, SOH calculator 710 may be configured to calculate SOH 120 of battery 100 according to $$SOH=TD \times CCC/FPTC \quad \text{Equation 5}$$

where
TD=the time duration determined in step 506,
CCC=a value of the constant charge current supplied in step 504, and
FPTC=a fixed percentage of the total charge capacity of battery 100.

For a lithium-based battery, charging of the battery with the constant charge current in step 504 is complete at approximately the same fixed percentage of the total charge capacity (FPTC) of the battery. FIG. 6 indicates an FPTC 602 for battery 100. The value of FPTC does not depend on the current total charge storage capacity (SOH 120) of the battery. According to this characteristic, the value of FPTC may be predetermined. This FPTC value does not vary substantially with battery age, and has a substantially constant value for a particular charge current and temperature range. For example, for a lithium battery, the value of FPTC may be approximately 75% for a particular charge current and temperature range, or may be another value. FIG. 6 shows FPTC 602 for a lithium battery as 75% of the total charge capacity of battery 100. A relationship between the FPTC and the measured accumulated charges (TD×CCC) provided to battery 100 during step 504 provides the state of health (e.g., in Coulombs or Ampere-hours) according to Equation 5 above.

The estimation provided by Equation 5 is typically more accurate when: (a) battery 100 is charged during step 504 from a substantially uncharged/empty state, (b) a temperature of the environment of battery 100 is in a normal ambient range (e.g., in the range of 10° Celsius to 40° Celsius), and (c) the constant current provided during step 504 is within bounds reasonable for battery 100 (e.g., is not a current level that distresses battery 100).

In one example of flowchart 500, the constant charge current supplied during first charge phase 208 in step 504 is 1 Amp, and first charge phase 208 has a time duration of 2725 seconds, as determined in step 506. In the current example, a value for FTCP 602 is 75%. In such an example, SOH 120 may be calculated in step 508 according to Equation 5 as follows:

$$SOH=2725 \text{ seconds} \times 1 \text{ Amp}/75\%$$

SOH=3633 Coulombs (or 1007 mAH).

Over a period of years, battery 100 of the current example may age, causing degradation in performance (e.g., increase in the volume of oxidized portion 106 shown in FIG. 1). In another iteration of flowchart 500 performed after such a time period, the constant charge current supplied during first charge phase 208 in step 504 may be 1 Amp, and first charge phase 208 may have a time duration of 2088 seconds (as determined in step 506). In this example, SOH 120 may be calculated in step 508 according to Equation 5 as follows:

$$SOH=2088 \text{ seconds} \times 1 \text{ Amp}/75\%$$

SOH=2784 Coulomb (or 773 mAH).

As shown in FIG. 7, processing logic 708 may further include a SOC calculator 712. After calculation of SOH in step 508, SOC calculator 712 may calculate a state of charge for battery 100 as described above (e.g., Equation 3) using the calculated SOH provided by SOH calculator 710. Alternatively, SOC calculator 712 may be configured to directly calculate a state of charge for battery 100 according to a combination of Equations 3 and 5 (e.g., without SOH being first calculated).

Processing logic 708, including SOH calculator 710 and SOC calculator 712, may be implemented in hardware, software, firmware, or any combination thereof. For example, in an embodiment, processing logic 708 may include one or more processors, and SOH calculator 710 and SOC calculator 712 may be implemented as code that is executed by the one or more processors. In another example embodiment, processing logic 708 may include hardware logic (e.g., an ASIC, logic gates, etc.) configured to perform the functions of SOH calculator 710 and SOC calculator 712. Processing logic 708 may include an analog to digital converter (ADC) to convert a measured analog current value to digital form, and/or to perform other analog to digital conversions if necessary. Alternatively, processing logic 708 may be configured to use an estimate of current values, rather than being configured to convert analog current values to digital form.

Figure 8:
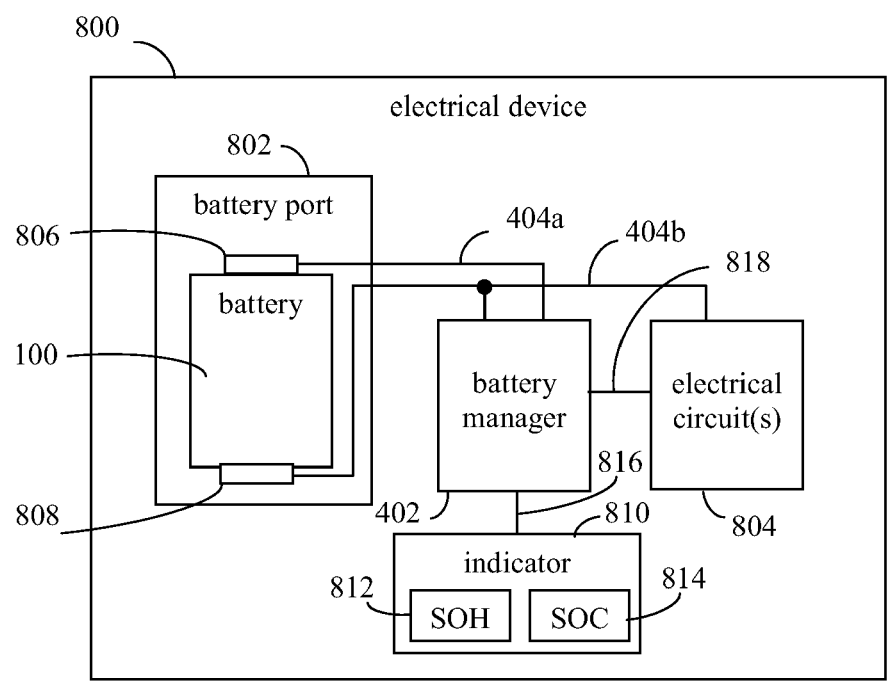
FIG. 8 shows a block diagram of an electrical device that incorporates a battery manager, according to an embodiment of the present invention.

Battery manager 402 shown in FIG. 4 may be implemented in any type of electronic/electrical device that includes one or more rechargeable batteries. For example, FIG. 8 shows a block diagram of an example electrical device 800 that incorporates battery manager 402, according to an embodiment of the present invention. As shown in FIG. 8, electrical device 800 includes a battery port 802, electrical circuit(s) 804, and battery manager 402. Battery port 802 is any type of battery port, including a recessed area, slot, or other opening configured to receive battery 802. In the example of FIG. 8, battery port 802 includes a first contact 806 and a second contact 808. A first terminal of battery 100 (e.g., terminal 102 or terminal 104 shown in FIG. 1) makes contact with first contact 806, and a second terminal of battery 100 makes contact with second contact 808. First and second contacts 806 and 808 are respectively electrically coupled by first and second electrical connections 404a and 404b to battery manager 402 to provide a path for electrical current to battery manager 402 (and to electrical circuit(s) 804 through battery manager 402).

In an embodiment, battery manager 402 may process a voltage received across first and second electrical connections 404a and 404b from battery 100 to generate a voltage signal that is output on a third electrical connection 818. For instance, battery manager 402 may filter the received voltage, may set the output voltage signal to a predetermined voltage value (e.g., using a voltage regulator), and/or may otherwise process the received voltage. Second electrical connection 404b (e.g., a ground signal) and third electrical connection 818 (e.g., a power signal) are received by electrical circuit(s) 804, to provide power to electrical circuit(s) 804 from battery 100.

Electrical connections 404a, 404b, and 818 may each include one or more electrically conductive connections, such as wires, cables, connectors, metal strips, etc, as would be known to persons skilled in the relevant art(s). First and second contacts 806 and 808 may be any type of contacts, conventional or otherwise, including metal contacts, as would be known to persons skilled in the relevant art(s). Note that the particular configuration for electrical device 800 shown in FIG. 8 is provided for purposes of illustration, and that electrical device 800 may be configured in alternative ways, as would be known to persons skilled in the relevant art(s).

Electrical device 800 may be any sort of electrical device that uses electrical power, and that includes one or more batteries. For example, electrical device 800 may be a stationary device or a portable device. Example devices for electrical device 800 include mobile computers (e.g., a Palm® device, a personal digital assistant (PDA), a laptop computer, a notebook computer, etc.), mobile email devices (e.g., a RIM Blackberry® device), mobile phones (e.g., a cell phone), a handheld media player such as a handheld music and/or video player (e.g., a Microsoft Zune™ device, an Apple iPod™ device, etc.), a handheld game console (e.g., a Nintendo DS™, a PlayStation Portable™, etc.), a wireless headset (e.g., a Bluetooth® headset), a personal navigation device (e.g. a handheld global position system (GPS) device), a handheld digital video camera, and any other electrical device. Electrical circuit(s) 804 may include any number of one or more electrical circuits providing functionality for electrical device 800, including computing/processing circuits, logic circuits, electromechanical circuits, video circuits, audio circuits, communications circuits, image capturing circuits, etc.

Electrical device 800 may optionally include an indicator 810, as shown in FIG. 8. Indicator 810 is configured as a battery state of health indicator to provide an indication of the calculated state of health of battery 100 and/or a calculated state of charge of battery 100. Indicator 810 receives a battery health information signal 816 from battery manager 402, which may include the calculated state of health and/or state of charge. As shown in FIG. 8, indicator 810 may display or otherwise output a state of health 812 and/or a state of charge 814 calculated by SOH calculator 710 and SOC calculator 712, respectively. Indicator 810 may be implemented in any manner to provide an indication of the calculated state of health 812 and/or calculated state of charge 814 of battery 100. For example, indicator 810 may include one or more light emitting diodes (LED), may include a textual readout and/or a graphical icon displayed by a display of electrical device 800, and/or may include any other visual and/or audio output device of electrical device 800. In an embodiment where indicator 810 includes one or more LEDs, a color, an intensity, a number of illuminated LEDs, and/or any other configuration of the LEDs may be used to indicate a calculated state of health 812 and/or state of charge 814. In an embodiment where indicator 810 includes a textual readout, the textual readout can display state of health 812 and/or state of charge 812 as actual values, as percentages representative of the state of health and/or state of charge, and/or according to any other textual indication. In an embodiment where indicator includes a graphical icon, the graphical icon may indicate state of health 812 and/or state of charge 814 in any manner, such as by showing a partial battery icon, etc.

In another embodiment, indicator 810 may be located in a second device that is separate from electrical device 800. Electrical device 800 may include a transmitter or other interface for transmitting the state of health and/or the state of charge output by battery manager 402 in battery health information signal 816 to the second device. For instance, in an embodiment, electrical device 800 may be a headset powered by battery 100, and the second device may be a telephone (e.g., a portable phone, such as a cell phone). The headset may transmit the state of health and/or state of charge information for battery 100 to the telephone. Indicator 810 may be a display of the telephone, which may display state of health 812 and/or state of charge 814 received from electrical device 800.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A method for determining battery state of health, comprising:
receiving a battery that is substantially uncharged;
charging the battery during a first charge phase during which the battery is charged with a substantially constant charge current and during a second charge phase during which a substantially constant voltage is applied to the battery;
measuring a time duration of the first charge phase only; and
calculating a state of health of the battery based upon the measured time duration and the constant charge current.

2. The method of claim 1, wherein said calculating comprises:
calculating the state of health (SOH) of the battery according to $$\text{SOH of the battery} = TD \times CCC / FPTC,$$

where
TD=the measured time duration,
CCC=the constant charge current, and
FPTC=a predetermined fixed percentage of a total charge capacity of the battery.

3. The method of claim 2, wherein the battery is a lithium battery.

4. The method of claim 1, further comprising:
displaying the calculated state of health of the battery.

5. The method of claim 1, further comprising:
calculating a state of charge of the battery based on the calculated state of health.

6. The method of claim 5, further comprising:
displaying the calculated state of charge of the battery.

7. A system for determining battery health, comprising:
a battery charger configured to charge a battery from a substantially uncharged state during a first charge phase during which the battery is charged with a substantially constant charge current and during a second charge phase during which a substantially constant voltage is applied to the battery;
a charge timer configured to measure a time duration of the first charge phase only; and a battery state of health calculator configured to calculate a state of health of the battery based upon the measured time duration and the constant charge current.

8. The system of claim 7, wherein the battery state of health calculator is configured to calculate the state of health (SOH) of the battery according to SOH of the battery=TD×CCC/FPTC, where
TD=the measured time duration,
CCC=the constant charge current, and
FPTC=a predetermined fixed percentage of a total charge capacity of the battery.

9. The system of claim 8, wherein the battery is a lithium battery.

10. The system of claim 8, further comprising:
an indicator configured to display the calculated state of health.

11. The system of claim 7, further comprising:
a battery state of charge calculator configured to calculate a state of charge of the battery based upon the calculated state of health.

12. The system of claim 11, further comprising:
an indicator configured to display the calculated state of charge.

13. A battery-powered electrical device, comprising:
a battery monitor that includes a battery charger, a charge timer, and a battery state of health calculator; and
a battery port configured to interface the battery with the device;
wherein the battery charger is configured to charge the interfaced battery from a substantially uncharged state during a first charge phase during which the battery is charged with a substantially constant charge current and during a second charge phase during which a substantially constant voltage is applied to the battery;
wherein the charge timer is configured to measure a time duration of the first charge phase only; and
wherein the battery state of health calculator is configured to calculate a state of health of the battery based upon the measured time duration and the constant charge current.

14. The device of claim 13, wherein the battery state of health calculator is configured to calculate the state of health (SOH) of the battery according to SOH of the battery=TD×CCC/FPTC, where
TD=the measured time duration,
CCC=the constant charge current, and
FPTC=a predetermined fixed percentage of a total charge capacity of the battery.

15. The device of claim 14, wherein the battery is a lithium battery.

16. The device of claim 13, further comprising
a battery state of health indicator configured to provide an indication of the calculated state of health of the battery.

17. The device of claim 16, wherein the battery state of health indicator includes at least one light emitting diode.

18. The device of claim 16, further comprising:
a display;
wherein the battery state of health indicator comprises a graphical icon displayed by the display.

19. The system of claim 8, wherein the FPTC has a value that does not vary substantially with battery age and is substantially constant for a particular charge current and temperature range.

20. The device of claim 14, wherein the FPTC has a value that does not vary substantially with battery age and is substantially constant for a particular charge current and temperature range.

* * * * *